(12) United States Patent
Kanno et al.

(10) Patent No.: US 8,509,715 B2
(45) Date of Patent: Aug. 13, 2013

(54) TRANSMITTER AND POWER SUPPLY CONTROL MODULE

(75) Inventors: Hirotoshi Kanno, Kawasaki (JP); Mitsunori Maeda, Kawasaki (JP); Takayoshi Ode, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 83 days.

(21) Appl. No.: 13/310,500

(22) Filed: Dec. 2, 2011

(65) Prior Publication Data

US 2012/0214431 A1 Aug. 23, 2012

(30) Foreign Application Priority Data

Feb. 18, 2011 (JP) ................................. 2011-033844

(51) Int. Cl.
*H04B 1/02* (2006.01)
*H01Q 11/12* (2006.01)

(52) U.S. Cl.
USPC ....................................................... 455/127.1

(58) Field of Classification Search
USPC .................... 455/126, 127.1, 127.2, 127.5
See application file for complete search history.

(56) References Cited

U.S. PATENT DOCUMENTS

| 6,141,541 | A * | 10/2000 | Midya et al. | 455/91 |
| 7,043,213 | B2 * | 5/2006 | Robinson et al. | 455/127.2 |
| 2006/0119425 | A1 | 6/2006 | Phillips et al. | |

FOREIGN PATENT DOCUMENTS

| JP | 03-034709 A | 2/1991 |
| JP | 03-276923 A | 12/1991 |
| JP | 03-289803 A | 12/1991 |
| JP | 06-077740 A | 3/1994 |
| JP | 2009-525695 A | 7/2000 |
| JP | 2006-512850 A | 4/2006 |
| JP | 2009-525684 A | 7/2009 |
| JP | 2009-525692 A | 7/2009 |
| JP | 2009-531929 A | 9/2009 |
| JP | 2010-508577 A | 3/2010 |
| KR | 2007-0093088 A | 9/2007 |
| KR | 2007-0112500 A | 11/2007 |
| WO | 2004/062145 A2 | 7/2004 |
| WO | 2007/092195 A2 | 8/2007 |
| WO | 2007/092233 A2 | 8/2007 |
| WO | 2007/092244 A2 | 8/2007 |
| WO | 2007/113726 A1 | 10/2007 |
| WO | 2008/054906 A2 | 5/2008 |

OTHER PUBLICATIONS

KR Office Action mailed on Jan. 28, 2013 in application No. 10-2011-140056; Full translation.

* cited by examiner

*Primary Examiner* — Blane J Jackson
(74) *Attorney, Agent, or Firm* — Maschoff Brennan

(57) ABSTRACT

A transmitter includes: a first envelope extractor that extracts a first envelope signal on the basis of a first modulated signal of a first frequency modulated with transmission data; a second envelope extractor that extracts a second envelope signal on the basis of a second modulated signal of a second frequency modulated with the transmission data, the second frequency being higher than the first frequency; an amplifier that amplifies one of the first modulated signal and the second modulated signal; a power adjuster that outputs a voltage of power supplied to the amplifier; and a controller that makes the amplifier amplify one of the first modulated signal and the second modulated signal and makes the power adjuster output the voltage of the supplied power on the basis of corresponding one of the first envelope signal and the second envelope signal.

5 Claims, 7 Drawing Sheets

FIG. 5

| | 70 COMMUNICATION SYSTEM | 71 FREQUENCY BAND | 72 | 73 | 74 | 75 | 76 |
|---|---|---|---|---|---|---|---|
| | | | 51 | 53 | 54 | 55 | 56 |
| 77 | GSM | LB | A1 | A2 | A3 | A4 | A5 |
| 78 | GSM | HB | B1 | B2 | B3 | B4 | B5 |
| 79 | WCDMA | LB | C1 | C2 | C3 | C4 | C5 |
| 80 | WCDMA | HB | D1 | D2 | D3 | D4 | D5 |
| 81 | LTE | LB | E1 | E2 | E3 | E4 | E5 |
| 82 | LTE | HB | F1 | F2 | F3 | F4 | F5 |

90

TRANSMITTER AND POWER SUPPLY CONTROL MODULE

CROSS-REFERENCE TO RELATED APPLICATION

This application is based upon and claims the benefit of priority of the prior Japanese Patent Application No. 2011-033844 filed on Feb. 18, 2011, the entire contents of which are incorporated herein by reference.

FIELD

The embodiments discussed herein are related to a transmitter which controls power supplied to an amplifier by means of envelope tracking.

BACKGROUND

A communication device to be used for wireless communication has a transmitter for transmitting a radio signal. The transmitter amplifies a modulated signal to be transmitted by means of an amplifier. The transmitter transmits the modulated signal amplified by the amplifier by radio through an antenna.

In a modulation system such as QPSK (Quadrature Phase Shift Keying), amplitude of the modulated signal temporally changes. The amplifier should preferably have a constant gain regardless of amplitude of a modulated signal inputted to the amplifier, in order to enhance reliability of the wireless communication. In order that the gain of the amplifier is made stable, a voltage value of power supplied to the amplifier is set according to maximum amplitude of the modulated signal to be inputted.

If the voltage of the power supplied to the amplifier is set according to the maximum amplitude of the modulated signal, the voltage of the power supplied to the amplifier remains high even if the amplitude of the modulated signal is small. If the amplitude of the modulated signal inputted to the amplifier is too small with respect to the voltage value of the power supplied to the amplifier, an amount of power loss of the amplifier grows high.

Change the voltage value of the power supplied to the amplifier according to the amplitude of the modulated signal inputted to the amplifier, so that the amount of power loss of the amplifier can be reduced. A method for changing the voltage of the power supplied to the amplifier on the track of a change of modulated amplitude with a frequency lower than the frequency of the modulated signal is called envelope tracking. Some technologies related to the envelope tracking according to a data rate of a transmitter are disclosed.

A technology related to the envelope tracking system is disclosed in Japanese Laid-open Patent Publication No. 06-77740 such that a transmitter extracts an envelope signal on the basis of a modulated signal outputted by a baseband processor. The extracted envelope signal is inputted to an output voltage control terminal of a DDC (DC DC Converter) which generates power supplied to an amplifier. As the DDC needs to respond to an amplitude change of the envelope signal, the disclosed system is fit for a communication system of a relatively low data rate around several hundred kHz such as a GSM (Global System for Mobile Communications) system.

A technology related to the envelope tracking is disclosed in Japanese Laid-open Patent Publication No. 2009-525684 such that a transmitter extracts an envelope signal from a modulated RF (Radio Frequency) signal. The transmitter of Japanese Laid-open Patent Publication No. 2009-525684 detects average power of the RF signal and extracts a difference between the detected signal and the RF signal to be transmitted so as to generate an envelope signal.

According to the envelope tracking system disclosed in Japanese Laid-open Patent Publication No. 2009-525684, a DDC produces a reference voltage of power supply to be applied to an amplifier on the basis of the average power of the detected RF signal, and superimposes the reference voltage of the power supply with the difference between the detected signal and the RF signal to be transmitted, as well. The reference voltage of the power supply is controlled in a closed loop including the amplifier. The closed loop includes an LPF (Low Pass Filter) for extracting the average power. A pass band of the LPF is optimized according to a frequency of the modulated signal. It is enough for the DDC of the disclosed system to follow the average power extracted by the LPF. The disclosed system is thereby compatible with a high data rate system of several tens MHz such as LTE (Long Term Evolution).

Suppose a transmitter to correspond to transmission of a plurality of modulated signals each having a different frequency. If the envelope tracking system of Japanese Laid-open Patent Publication No. 06-77740 is employed for such a transmitter, the DDC needs to correspond to an envelope signal of a high frequency. The higher frequency the DDC corresponds to, the lower conversion efficiency the DDC suffers, and thus causes power consumption efficiency of the entire transmitter to decrease. Meanwhile, if the envelope tracking system of Japanese Laid-open Patent Publication No. 2009-525684 is employed, it is necessary to optimize the pass band of the LPF according to a modulated signal of a high frequency. Then, the pass band of the LPF is made too broad in an operation according to a low bit rate communication system, and thus noise components can easily pass the LPF. As a result, the reference voltage value of the power supply outputted by the DDC is made unstable.

SUMMARY

According to an aspect of the embodiment, a transmitter includes a first envelope extractor that extracts a first envelope signal on the basis of a first modulated signal of a first frequency modulated with transmission data, a second envelope extractor that extracts a second envelope signal on the basis of a second modulated signal of a second frequency modulated with the transmission data, the second frequency being higher than the first frequency, an amplifier that amplifies one of the first modulated signal and the second modulated signal, a power adjuster that outputs a voltage of power supplied to the amplifier, and a controller that makes the amplifier amplify one of the first modulated signal and the second modulated signal and makes the power adjuster output the voltage of the supplied power on the basis of corresponding one of the first envelope signal and the second envelope signal.

The object and advantages of the embodiment will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 illustrates a control table of the controller;

DESCRIPTION OF EMBODIMENTS

The embodiment will be explained below. Incidentally, a combination of constitutions of respective embodiments is included in the embodiment of the present invention.

Figure 1:
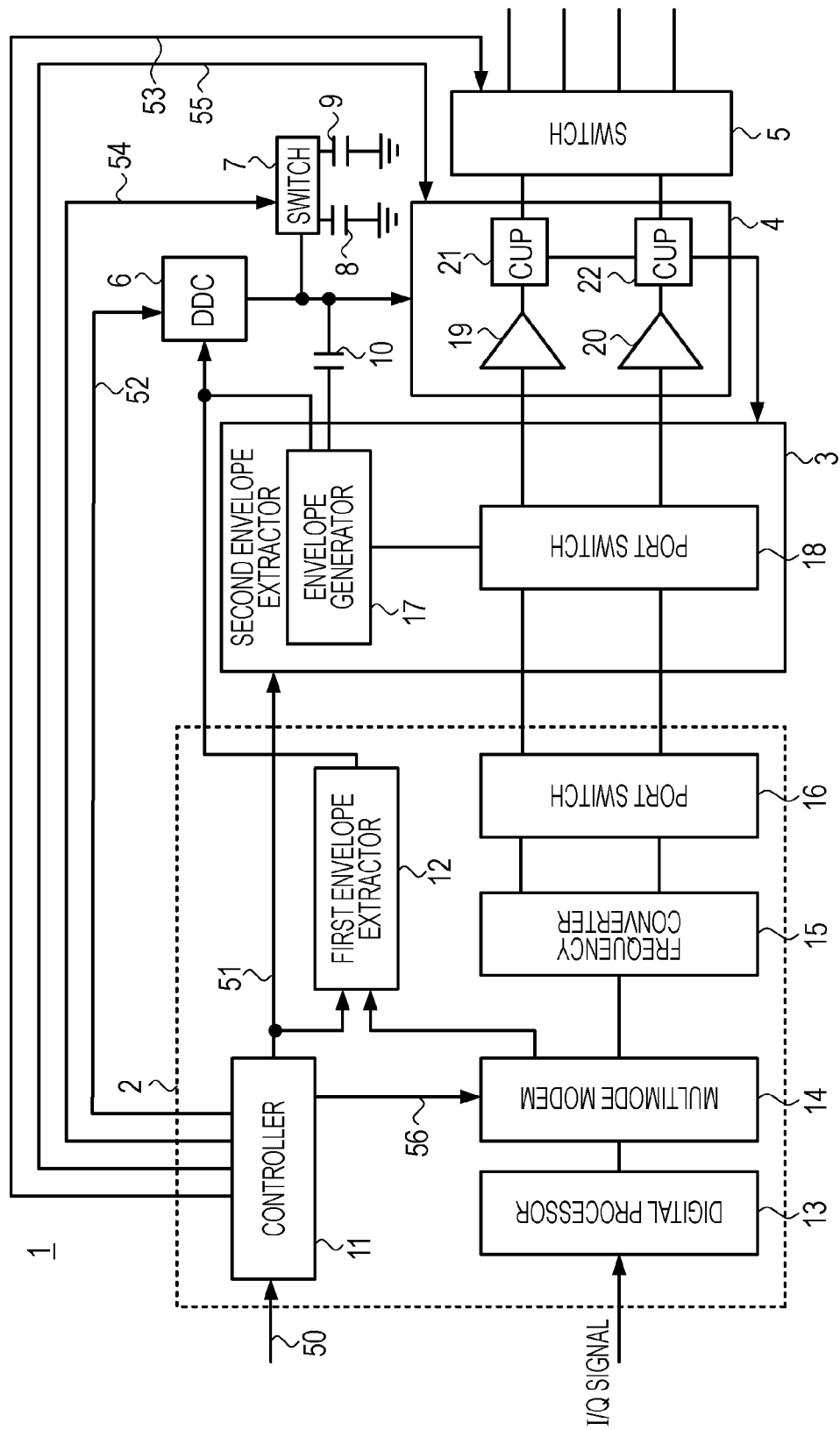
FIG. 1 is a block diagram of a transmitter of the embodiment.

FIG. 1 is a block diagram of a transmitter 1 of the embodiment. The transmitter 1 receives an I/Q-mapped digital signal outputted by a wireless modem of a mobile terminal device. The transmitter 1 converts the I/Q-mapped digital signal into a selected communication system and a selected frequency. The transmitter 1 mixes the converted I/Q signal with a carrier wave. The transmitter 1 amplifies the mixed I/Q signal by means of a power amplifier. The transmitter 1 transmits the amplified I/Q signal as an RF signal from an antenna.

The transmitter 1 has an RF (Radio Frequency) processor 2, a second envelope extractor 3, a PA (Power Amplifier) 4, a switch 5, a DDC (DC-to-DC Converter) 6 a switch 7 and capacitors 8 and 9.

The RF processor 2 modulates an I/Q signal to be transmitted by wireless according to a communication system and converts a frequency of the modulated signal into a frequency to be transmitted by wireless. The RF processor 2 has a controller 11, a first envelope extractor 12, a digital processor 13, a multimode modem 14, a frequency converter 15 and a port switch 16.

The controller 11 outputs a control signal for changing an operation of the transmitter 1 according to a selection signal 50 for selecting a communication system. The controller 11 optimizes timings of transmitting a plurality of control signals to be transmitted, so as to change over exactly from one communication system to another communication system. A baseband processor which is not illustrated in the mobile terminal device searches the communication systems. The baseband processor transmits the selection signal to the controller 11 on the basis of a searched result.

The first envelope extractor 12 extracts an envelope component on the basis of a modulated signal modulated with transmission data. The first envelope extractor 12 outputs an envelope signal for adjusting a voltage value of power supplied by the DDC. The output of the first envelope extractor 12 is made effective according to a set value of a control signal 51. The first envelope extractor 12 may be effectively supplied with power according to the set value of the control signal 51. Stop supplying power to the first envelope extractor 12 having no need to work, so that power consumption can be reduced. Details of the first envelope extractor 12 will be described later.

The digital processor 13 divides the received I/Q signal into I and Q channels.

The multimode modem 14 modulates the I/Q signal according to a communication system and a carrier frequency selected on the basis of a control signal 56 transmitted from the controller 11. The multimode modem 14 processes the I/Q signal according to a bandwidth of a digital filter having been changed on the basis of the control signal 56. The multimode modem 14 outputs the I/Q signal processed by the digital filter to the first envelope extractor 12. The multimode modem 14 D/A (Digital/Analog) converts the I/Q signal processed by the digital filter.

The frequency converter 15 frequency-converts the I/Q signal converted into an analog signal into a carrier frequency band for RF transmission. The carrier frequency band corresponds to an input terminal to which the modulated signal is inputted in the frequency converter 15. The frequency converter 15 outputs the frequency-converted modulated signal to the port switch 16.

The port switch 16 determines an amplifier that the modulated signal is connected to according to the selected communication system and the selected carrier frequency. The port switch 16 changes where its output goes according to what the modulated signal is connected to having been determined. The port switch 16 may change where its output goes on the basis of a control signal provided by the controller 11.

The second envelope extractor 3 extracts an envelope signal on the basis of a modulated signal of a frequency higher than that of the modulated signal processed by the first envelope extractor 12. A voltage value of power supplied by the DDC 6 is adjusted on the basis of the extracted envelope signal. The second envelope extractor 3 has an envelope generator 17 and a port switch 18. The second envelope extractor 3 effectively works according to the control signal 51. The envelope generator 17 may be effectively supplied with power according to a set value of the control signal 51. Stop supplying power to the envelope generator 17 having no need to work, so that power consumption can be reduced.

The envelope generator 17 outputs an envelope signal to be used for adjustment of a voltage value of power supplied by the DDC 6 on the basis of contrast in amplitude between the modulated signal inputted from the port switch 18 and a waveform of the modulated signal amplified by the PA 4 and attenuated by a certain ratio. Details of the envelope generator 17 will be described later.

The port switch 18 connects the output of the port switch 16 and the input to the PA 4. The port switch 18 outputs the modulated signal to the envelope generator 17 according to the input of the modulated signal to the PA 4. The port switch 18 may change where its output goes on the basis of the control signal 51 provided by the controller 11.

The PA 4 is an amplifier which amplifies a modulated signal received from the RF processor 2. The PA 4 has a plurality of amplifiers 19 and 20 and a plurality of CUPs (Couplers) 21 and 22. The PA 4 changes an amplifier that the voltage of the power supplied by the DDC 6 is applied to according to a set value of a control signal 55 transmitted by the controller 11.

The amplifier 19 provides the CUP 21 with an output. The amplifier 20 provides the CUP 22 with an output. The amplifiers 19 and 20 each amplify a carrier wave received from the second envelope extractor 3. The amplifiers 19 and 20 are different from each other in electric characteristics. The amplifiers 19 and 20 may be, e.g., for a low frequency band of several hundred MHz and for a high frequency band of several GHz, respectively. The amplifiers 19 and 20 output amplified signals to the CUPs 21 and 22, respectively. The CUPs 21 and 22 are each a kind of directional coupler which gives the second envelope extractor 3 feedback of some of the amplified signals received from the amplifiers 19 and 20, respectively. The envelope generator 17 is provided with some of the feedback of the amplified signal. Incidentally, although having two amplifiers and two CUPs as to the embodiment, the PA 4 may have three or more amplifiers and three or more CUPs.

The switch 5 changes a process for filtering the modulated signal before being transmitted by radio through the antenna according to the selected communication system. A plurality of outputs of the switch 5 are each connected to each of a plurality of filters different from one another. A filter characteristic of a connected filter is optimized according to a frequency band of a carrier wave. The frequency converter 15 sets a frequency band of the carrier wave according to the communication system. The controller 11 provides the switch 5 with a control signal 53 to which a value is set according to the communication system. The switch 5 changes the filter that its output is connected to according to a value set to the control signal 53 received from the controller 11.

The DDC 6 is a power adjuster which supplies the PA 4 with power. The DDC 6 changes a voltage value of the power supply according to an envelope signal outputted from the first envelope extractor 12 or from the second envelope extractor 3. Set a frequency with which the DDC 6 works in consideration of one of a higher frequency of the envelope signals outputted by the first envelope extractor 12 and the second envelope extractor 3. The DDC 6 changes an output voltage value in accordance with a change of the inputted envelope signal.

Incidentally, upon a switch being provided on an input portion of the DDC 6, one of the two envelope signals may be selected as the one inputted to the DDC 6 by means of a control signal coming from the controller 11.

The switch 7 connects the capacitor 8 or 9 to a power supply line of the PA 4 according to a set value of a control signal 54 outputted by the controller 11. The PA 4 connects the amplifier 19 or 20 to the power supply line in accordance with a set value of the control signal 55. The amplifiers 19 and 20 are different from each other in electric characteristics such as power consumption or gains. An optimum capacitance value of a capacitor for stable operation of an amplifier differs depending upon the electric characteristics of the amplifier. Connect an optimum capacitor to the amplifier according to the electric characteristics of the selected amplifier so that the controller 11 can stably work the amplifier.

A capacitor for making a voltage of power supplied to an amplifier stable is called a bypass capacitor. The bypass capacitor works as a filter on an envelope signal frequency for adjusting the voltage of the power supplied to the PA 4 by means of envelope tracking. Thus, no bypass capacitor should ideally and preferably be installed. Without a bypass capacitor, though, the voltage of the power supplied to the amplifier becomes unstable resulting in unstable operation of the amplifier.

Select a capacitance value of the bypass capacitor of the amplifier in such a way as to raise impedance of the power supply line of the amplifier and to lower impedance for a second harmonic wave of a variable frequency of the power supply voltage propagated through the power supply line. That is, the optimum value of the bypass capacitor of the amplifier is determined depending upon the electric characteristics of the amplifier and the frequency of the envelope signal inputted to the DDC 6.

If the envelope signal is extracted from a modulated signal in a GSM system, set the capacitance value to around 1000 pF which gives high impedance at several hundred MHz. Meanwhile, if the envelope signal is extracted from a modulated signal in an LTE system, the envelope signal is filtered upon the capacitance value remaining on 1000 pF. Thus, the capacitance value of the bypass capacitor needs to be set as low as around 100 pF which gives high impedance at several tens MHz. Change the capacitor connected to the power supply line according to the communication system by using the switch 7 so that the capacitance value most suitable for the communication system having been selected can be set, as described above.

The bypass capacitor may be installed in the PA 4. Install the bypass capacitor close to the PA 4, so that effects of inductance and capacitance components parasitic on the power supply line can be reduced.

A capacitor 10 prevents a dc component of a signal outputted by the envelope generator 17 and makes an ac component only flow into the power supply line of the PA 4. The PA 4 is supplied with an ac voltage component passed by the capacitor 10 and combined with the dc voltage of the power supplied by the DDC 6.

As described above, the transmitter 1 changes a value set to the control signal outputted by the controller 11 according to the communication system so as to optimize the envelope signal which determines the output voltage value of the DDC 6. The transmitter 1 can thereby optimize a voltage of the power supplied to the amplifier according to a changeover of the communication system.

Figure 2:
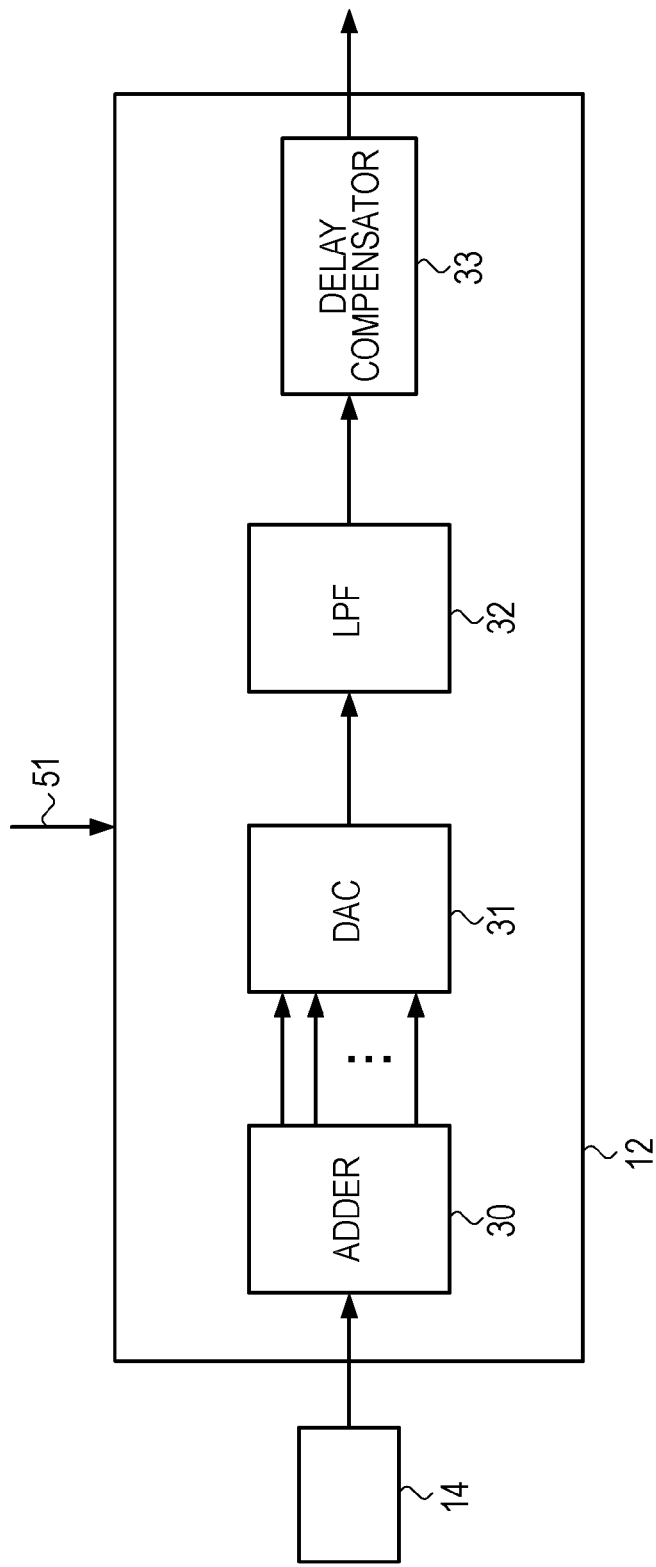
FIG. 2 is a detailed block diagram of a first envelope extractor.

FIG. 2 is a detailed block diagram of the first envelope extractor 12. When a communication system of a low frequency such as GSM is selected, as described above, the first envelope extractor 12 extracts an envelope signal for adjusting an output voltage of the DDC 6. The first envelope extractor 12 has an adder 30, a DAC (Digital Analog Converter) 31, an LPF (Low Pass Filter) 32 and a delay compensator 33.

The adder 30 synthesizes I and Q signals outputted by the multimode modem 14. The adder 30 outputs an added result as a digital signal. The DAC 31 converts the digital signal received from the adder 30 into an analog signal. The DAC outputs the converted analog signal. The LPF 32 removes a high frequency component which is a carrier wave of the analog signal received from the DAC 31. As the high frequency component is removed, the first envelope extractor 12 can obtain an envelope of the analog signal before the high frequency component is removed. The LPF 32 outputs the analog signal after the high frequency component is removed as an envelope signal. The delay compensator 33 compensates for a processing delay caused by the first envelope extractor 12 so that the modulated signal inputted to the PA 4 is synchronized with the voltage of the power supplied to the PA 4. The delay compensator 33 outputs the envelope signal whose delay has been compensated for.

Figure 3:
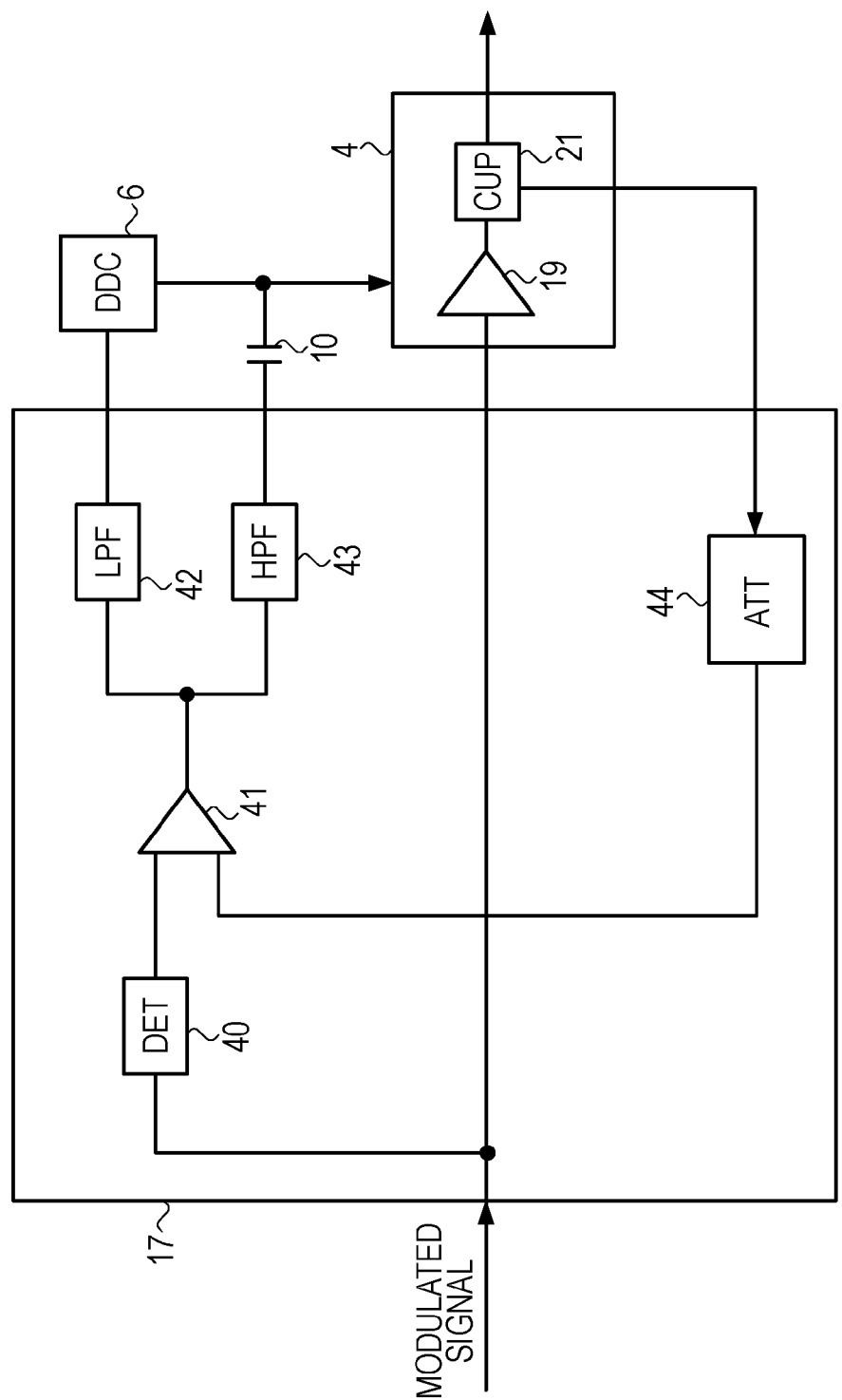
FIG. 3 is a detailed block diagram of an envelope generator.

FIG. 3 is a detailed block diagram of the envelope generator 17. When a communication system of a high frequency is selected, as described above, the envelope generator 17 extracts an envelope signal for adjusting an output voltage of the DDC 6. The envelope generator 17 has a DET (Detector) 40, an error amplifier 41, an LPF 42, an HPF (High Pass Filter) 43 and an ATT (Attenuator) 44. Incidentally, suppose that the PA 4 of the embodiment is set in such a way that the amplifier 19 and the CUP 21 effectively work.

The DET 40 detects the modulated signal outputted by the port switch 18 in amplitude. The DET 40 outputs the detected signal detected in amplitude to the error amplifier 41.

The amplifier 19 amplifies the modulated signal outputted by the port switch 18 by a certain gain. The amplifier 19 outputs the amplified modulated signal. The CUP 21 separates and outputs a certain ratio of the amplified modulated signal. The ATT 44 attenuates the modulated signal received from the CUP 21 by a certain loss. The ATT 44 outputs the attenuated modulated signal to the error amplifier 41.

The error amplifier 41 is a comparator which compares the amplitudes of the detected signal received from the DET 40 and the modulated signal received from the ATT 44. The error amplifier 41 outputs a voltage waveform according to a compared result.

The LPF 42 outputs a low frequency component remaining after a high frequency component is removed from the voltage waveform as an envelope signal. The DDC 6 outputs a power supply voltage according to the envelope signal outputted by the LPF 42. The PA 4 is supplied with the power supply voltage outputted by the DDC 6 through the power supply line.

The HPF 43 cuts off the low frequency component of the voltage waveform and outputs a high frequency signal. The capacitor 10 cuts off a dc component of the high frequency signal outputted by the HPF 43. One of the terminals of the capacitor 10 is connected to the power supply line connected from the DDC 6 to the PA 4. The power supply voltage outputted by the DDC 6 is superimposed with a voltage of a high frequency signal remaining after the dc component is cut off by the capacitor 10.

The voltage of the power supplied from the DDC 6 to the PA 4 is a sum of a certain dc voltage and an ac voltage having am amplitude greater than the certain dc voltage as described above. The voltage value of the power supplied to the PA 4 is thereby in accordance with an amplitude change of the modulated signal inputted to the PA 4. Further, make the power supply voltage track only an ac voltage of an amplitude greater than the certain dc voltage, so that the voltage value supplied to the PA 4 can track an amplitude change of the modulated signal even if the DDC 6 is slow to respond.

Figure 4:
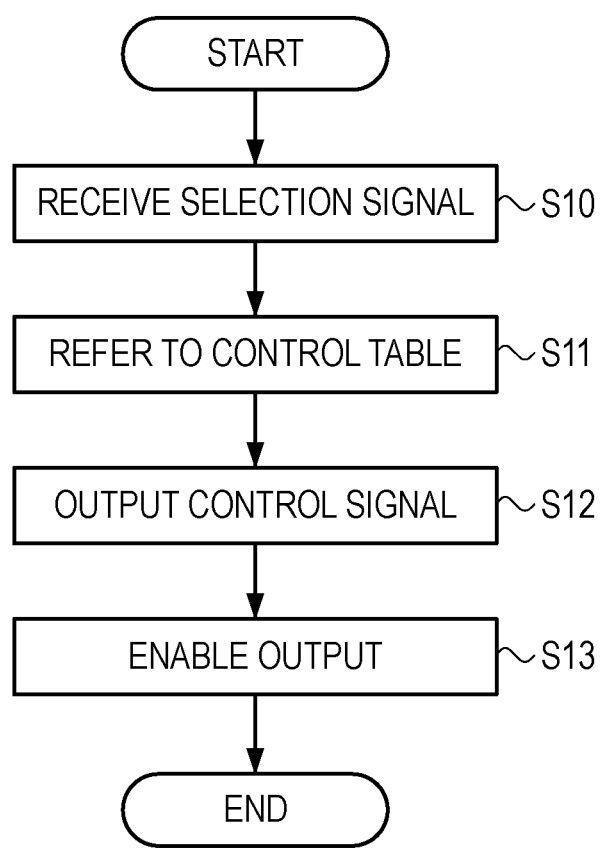
FIG. 4 is a control flow diagram of a controller.

FIG. 4 is a control flow diagram of the controller 11. The controller 11 receives a selection signal 50 which instructs to change the communication system (step S10). The selection signal 50 is, e.g., a control signal of the RF processor 2 in time of Inter-RAT Handover. The process illustrated in FIG. 4 is written in a control program stored in the controller 11, etc. The controller 11 achieves the control illustrated in FIG. 4 by running the control program.

Upon receiving the selection signal 50, the controller 11 refers to a control table 90 on the basis of a set value of the selection signal 50 (step S11). The control table 90 may be stored in a memory area installed in the controller 11 or in an external memory of the controller 11.

The controller 11 obtains set values of the control signals 51, 53, 54, 55 and 56 according to the communication system and the frequency of the modulated signal by referring to the control table 90. The controller 11 outputs the obtained control signals to the respective portions of the transmitter 1 in proper timing as described later (step S12).

After outputting the control signals to the respective portions of the transmitter 1 in proper timing and completing the changeover process of the respective portions, the controller 11 enables the RF processor 2 to output the modulated signal (step S13). As enabling the output of the modulated signal after running the changeover process of the respective portions in proper timing, the controller 11 can optimize the voltage value of the power supplied to the amplifier of the transmitter 1 according to the selected communication system and the frequency band.

FIG. 5 illustrates the control table 90 that the controller 11 refers to so as to determine the set values of the control signals upon receiving the selection signal. On the control table 90, columns 70 and 71 include communication systems and frequency bands set to the selection signal 50. The column 70 indicates that the selectable communication systems are three types which are GSM, WCDMA (Wideband Code Division Multiple Access) and LTE. In the frequency band column 71, entries LB (Low Band) and HB (High Band) indicate low frequency bands and high frequency bands in the individual communication systems, respectively. The frequency bands each may be specifically distinctive for each of the communication systems. A frequency in each of the frequency bands can be specified for every combination of the communication systems and the frequency bands.

On the control table 90, columns 72-76 include values set to the control signals 51, 53, 54, 55 and 56 which are referred to on the basis of the selection signal 50. Although the embodiment is explained in such a way that the controller 11 selects one of the combinations of the communication systems and the frequency bands included in the columns 70 and 71, respectively, what is selected is not limited to the entries on the control table 90.

On the control table 90, rows 77-82 include values set to the control signals 51, 53, 54, 55 and 56 corresponding to the respective communication systems and the frequency bands. The row 77, e.g., includes values set to the respective control signals in a case where the controller 11 selects GSM and LB as the communication system and the frequency band, respectively. The row 77 indicates that the control signals 51, 53, 54, 55 and 56 are allotted 'A1', 'A2', 'A3', 'A4' and 'A5', respectively. So does each of the other rows 78-82, and their explanations are omitted.

The controller 11 refers to the control table 90 on the basis of the information as to the communication system and the frequency band included in the received selection signal 50 as described above. The controller 11 can fix the values set to the respective control signals to be transmitted to the respective portions of the transmitter 1 by referring to the control table 90.

Figure 6:
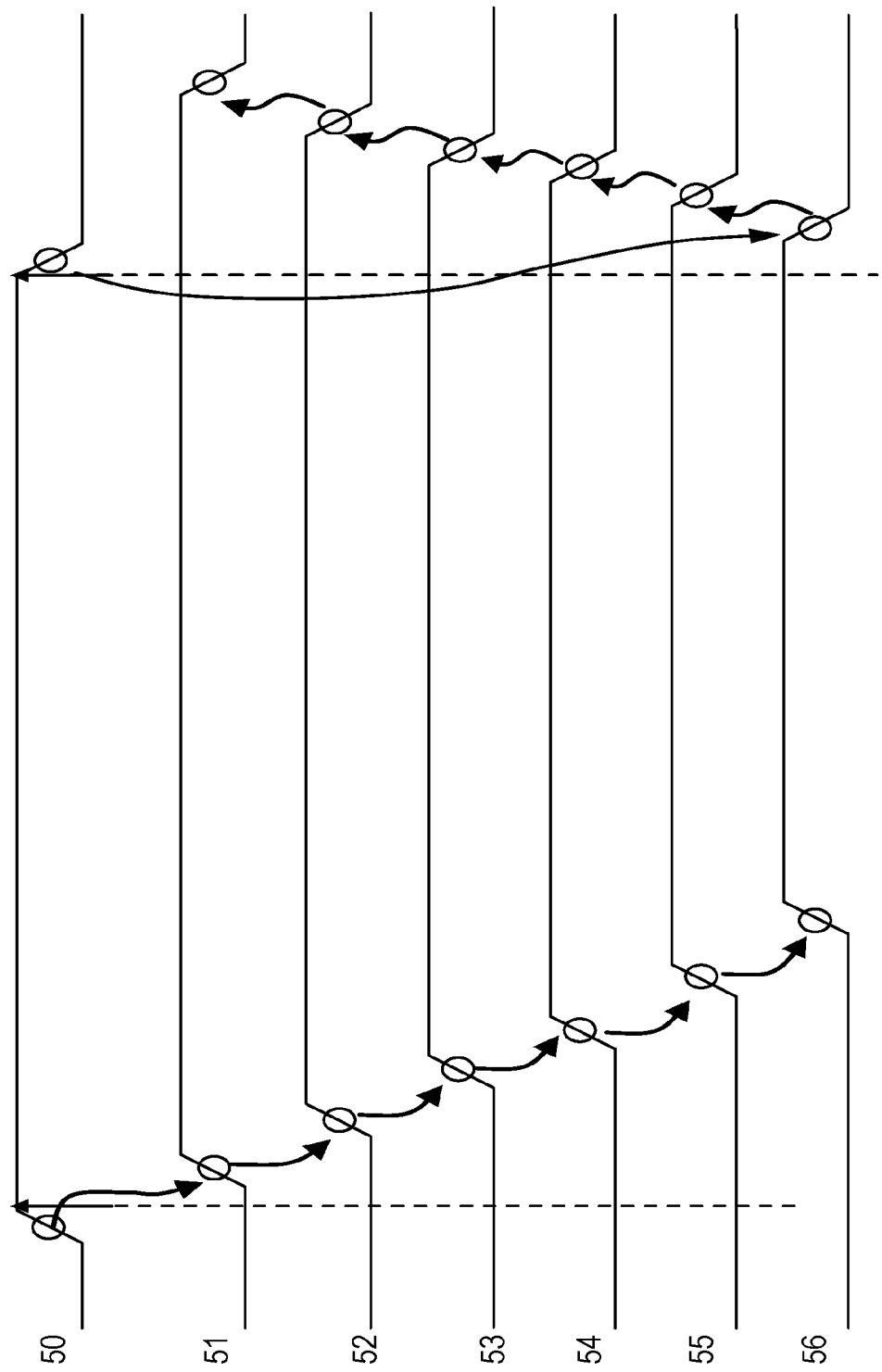
FIG. 6 is a timing chart of control signals outputted by the controller.

FIG. 6 is a timing chart of the control signals outputted by the controller 11. The waveforms illustrated in FIG. 6 are each given a figure corresponding to the reference numeral of each of the control signals in the transmitter 1 illustrated in FIG. 1. Further, the waveforms each change a level, which indicates that the control signal changes over from a value set to one of the systems to a value set to another one of the systems.

The controller 11 receives the selection signal 50. The controller 11 determines the communication system and a band path of the modulated signal according to the value set to the selection signal 50. The controller 11 outputs the control signal 51 according to the determined band path of the modulated signal. The control signal 51 is a signal to make one of the first envelope extractor 12 and the second envelope extractor 3 effectively work.

The controller 11 transmits a control signal 52 for powering the DDC 6 on. The DDC 6 consumes power even in an idling state. The controller 11 powers the DDC 6 off before the communication system is determined so that power consumption of the transmitter 1 can be reduced.

After a certain period of time since transmitting the control signal 52 for powering the DDC 6 on, the controller 11 transmits the control signal 53 for changing an antenna to be connected with to the switch 5. That is because the DDC 6 requires a longer period of time since being powered on until being ready to be driven than a period of time that the switch 5 requires until finishing a changeover operation. Suppose, e.g., that the switch 5 requires 5 μs until finishing a changeover operation, and that the DDC 6 requires 10 μs until being ready to be driven. In this case, the controller 11 arranges to transmit the control signal 53 after 5 μs or longer since transmitting the control signal 52.

The controller 11 transmits the control signal 54 to the switch 7 so as to change a capacitor to be connected to. Connect the capacitor to the power supply line before the DDC 6 starts supplying the power, so as to charge the capacitor before the power is supplied. Charge the capacitor before the power is supplied, so that a current flows into the capacitor when the DDC 6 starts supplying the power and the power supply voltage can be prevented from abruptly falling down.

The controller 11 transmits the control signal 55 to the PA 4 so as to change the amplifier to be made effectively work. Activate the amplifier immediately before transmitting a signal to be amplified as an idling current flows even while the amplifier is being provided with no signal. The controller 11 releases and enables the output of the PA 4 after activating the amplifier.

The controller 11 transmits the control signal 56 to the multimode modem 14 so as to set a modem process according to the communication system. After the multimode modem 14 finishes being set, the RF processor 2 starts a modulation process of the I/Q signal. The PA 4 which amplifies and transmits the modulated signal and the DDC 6 which supplies the PA 4 with power are ready before the RF processor 2 outputs the modulated signal. The transmitter 1 can thereby stably amplify and transmit the modulated signal immediately after the changeover operation.

Figure 7:
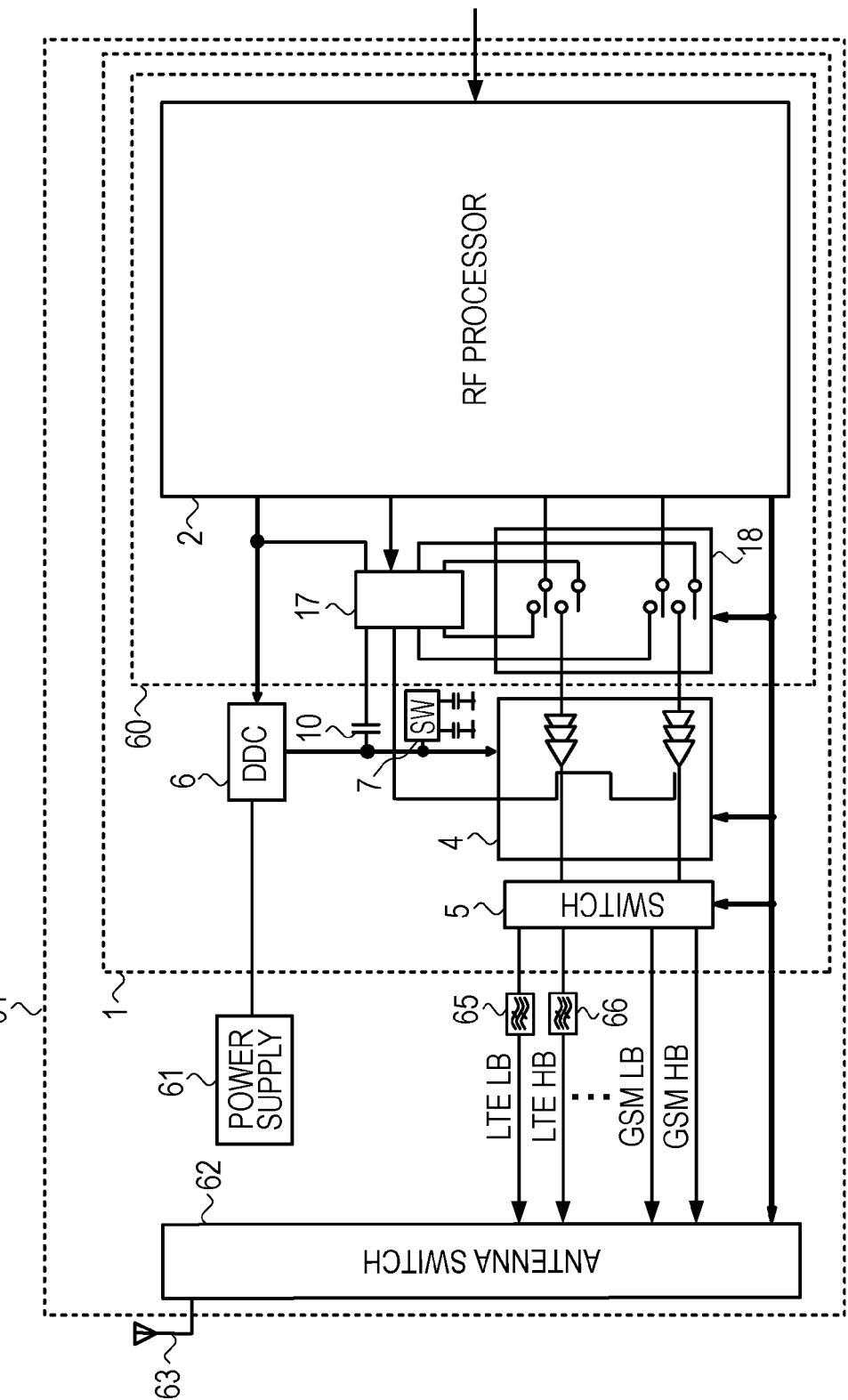
FIG. 7 is a block diagram of an installed wireless communication device.

FIG. 7 is a block diagram of an installed wireless communication device 64. The wireless communication device 64 has the transmitter 1, a power supply unit 61, an antenna switch 62, an antenna 63 and filters 65 and 66. In FIG. 7, each of portions which is a same as the corresponding one in the block diagram of the transmitter 1 illustrated in FIG. 1 is given a same reference numeral, and its explanation is omitted.

The RF processor 2 is implemented by means of a CMOS (Complementary Metal Oxide Semiconductor) process in the transmitter 1. The envelope generator 17 and the port switch 18 can be implemented by means of the CMOS process, as well. The RF processor 2, the envelope generator 17 and the port switch 18 can thereby form a power supply control module 60 by means of the same CMOS process. The power supply control module 60 outputs a modulated signal to the PA 4, and outputs an envelope signal for adjusting an output voltage value of the DDC 6 which generates a voltage of power supplied to the PA 4 as well. Integrate the first envelope extractor 12 and the second envelope extractor 3 in a single module so as to downsize the wireless communication device 64.

As being implemented by means of a GaAs process in general, the PA 4 is in a chip different from that of the power supply module 60. Further, as the DDC 6 is inseparable from lots of power consumption and heat generation, it is difficult to integrate the DDC 6 and the power supply module 60 in one and the same chip. The wireless communication device 64 includes envelope extracting systems different from each other in one module and makes them share the DDC 6, so as to optimize power supplied to the PA 4 in accordance with a plurality of communication systems of different frequency bands, and to downsize the device as well.

The power supply unit 61 supplies the DDC 6 with power. The power supply unit 61 of a mobile wireless communication device is a battery in general.

The filters 65 and 66 filters the modulated signal outputted by the PA 4 in accordance with its frequency band so as to remove unnecessary high frequency components, etc. Although only the LTE lines of the embodiment are equipped with the filters, so may be the GSM lines.

The antenna switch 62 selects the modulated signal having been filtered, and transmits the modulated signal to the antenna 63. The antenna 63 transmits the modulated signal received from the antenna switch to another device.

The wireless communication device 64 can optimize power supplied to the PA 4 in accordance with a plurality of communication systems of different frequency bands and can downsize the device as well, as described above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A transmitter comprising:
a first envelope extractor that extracts a first envelope signal on the basis of a first modulated signal of a first frequency modulated with transmission data;
a second envelope extractor that extracts a second envelope signal on the basis of a second modulated signal of a second frequency modulated with the transmission data, the second frequency being higher than the first frequency;
an amplifier that amplifies one of the first modulated signal and the second modulated signal;
a power adjuster that outputs a voltage of power supplied to the amplifier; and
a controller that makes the amplifier amplify one of the first modulated signal and the second modulated signal and makes the power adjuster output the voltage of the supplied power on the basis of corresponding one of the first envelope signal and the second envelope signal.

2. The transmitter according to claim 1, wherein
the first envelope extractor has a first low-pass filter that outputs the first envelope signal remaining after a high frequency component of the first modulated signal is removed, and
the second envelope extractor has
a comparator that outputs a voltage waveform according to contrast between an amplitude of the second modulated signal and an amplitude of a waveform formed after the modulated signal is amplified by the amplifier and attenuated by a certain ratio, and
a second low-pass filter that outputs the second envelope signal remaining after a high frequency component of the voltage waveform is removed, the second envelope extractor having a high-pass filter that superimposes the voltage of the power supplied by the power adjuster with a waveform remaining after a low frequency component of the voltage waveform is removed.

3. The transmitter according to one of claim 1, wherein
the amplifier has a plurality of amplifier segments each having a different electric characteristic, the amplifier having a plurality of bypass capacitors each corresponding to each of the amplifier segments, the bypass capacitors each having a different capacitance value, and
the transmitter changes one of the amplifier segments connected to the power adjuster and one of the bypass capacitors according to the frequency of one of the first modulated signal and the second modulated signal.

4. The transmitter according to claim 3, wherein
the amplifier changes connections between the amplifier segments and the power adjuster, and the transmitter changes the connections with the amplifier segments after changing the first envelope signal or the second envelope signal inputted to the power adjuster and changing connections with the bypass capacitors.

5. A power supply control module configured to output, to an amplifier that amplifies a signal, one of a first modulated signal of a first frequency modulated with transmission data and a second modulated signal of a second frequency modulated with the transmission data, the second frequency being higher than the first frequency, the power supply control module being configured to output an envelope signal for adjusting an output voltage value of a power adjuster that generates a voltage of power supplied to the amplifier, the power supply control module comprising:

a first envelope extractor that outputs a first envelope signal to the power adjuster on the basis of the first modulated signal;

a second envelope extractor that outputs a second envelope signal to the power adjuster on the basis of the second modulated signal; and a controller that makes the power adjuster generate the voltage of the power on the basis of one of the first envelope signal and the second envelope signal corresponding to one of the first modulated signal and the second modulated signal to be outputted to the amplifier.

* * * * *